(12) United States Patent
Kejariwal et al.

(10) Patent No.: US 7,643,573 B2
(45) Date of Patent: Jan. 5, 2010

(54) POWER MANAGEMENT IN A DATA ACQUISITION SYSTEM

(75) Inventors: Murari Kejariwal, Austin, TX (US); John R. Coupe, II, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 511 days.

(21) Appl. No.: 11/378,009

(22) Filed: Mar. 17, 2006

(65) Prior Publication Data

US 2007/0217544 A1 Sep. 20, 2007

(51) Int. Cl.
H04L 25/03 (2006.01)
H04L 27/08 (2006.01)
H04L 7/00 (2006.01)

(52) U.S. Cl. .................. 375/297; 375/345; 375/354; 330/278

(58) Field of Classification Search .......... 375/297, 375/345, 354, 355; 330/285, 296, 131, 132, 330/256, 278; 348/572; 340/870.12; 341/139, 341/155; 455/127.1, 127.2, 127.5, 136, 138, 455/232.1, 240.1, 250.1, 251.1, 574

See application file for complete search history.

(56) References Cited

U.S. PATENT DOCUMENTS

| | | | | |
|---|---|---|---|---|
| 5,677,962 A * | 10/1997 | Harrison et al. | ............. | 381/109 |
| 5,880,639 A * | 3/1999 | Sakuragi | ............... | 330/255 |
| 6,115,726 A * | 9/2000 | Ignjatovic | ................ | 708/300 |
| 6,242,983 B1 * | 6/2001 | Shiao | ................ | 330/285 |
| 6,498,927 B2 * | 12/2002 | Kang et al. | ............. | 455/245.2 |
| 6,771,129 B2 * | 8/2004 | Riishøj et al. | ............ | 330/285 |
| 6,864,817 B1 * | 3/2005 | Salvi et al. | ............... | 341/139 |
| 7,120,411 B2 * | 10/2006 | Darabi | ................ | 455/240.1 |
| 7,202,805 B2 * | 4/2007 | Sherry et al. | ............ | 341/120 |
| 7,405,683 B1 * | 7/2008 | Perrin et al. | ............ | 341/139 |
| 7,408,493 B2 * | 8/2008 | Lusky et al. | ............ | 341/139 |
| 2003/0160599 A1 * | 8/2003 | Mouret et al. | ............ | 323/315 |
| 2005/0179468 A1 * | 8/2005 | Zhou et al. | ............... | 326/115 |
| 2006/0049875 A1 * | 3/2006 | Boos | ................ | 330/279 |
| 2006/0221243 A1 * | 10/2006 | Huang et al. | ............ | 348/572 |

* cited by examiner

Primary Examiner—Tesfaldet Bocure
Assistant Examiner—Lawrence B Williams
(74) Attorney, Agent, or Firm—Davis Chin; Steven Lin; Gregory S. Thomas

(57) ABSTRACT

A data acquisition system includes a programmable gain amplifier, an analog-to-digital converter, a filter, and control circuitry. The programmable gain amplifier is operatively connected to receive an analog input signal on its input and generates an amplified signal on its output in accordance with gain control signals. The analog-to-digital converter is operatively connected to receive the amplified signal from the amplifier and generates a digitized signal on its output. The filter is operatively connected to receive the digitized signal from the converter and generates a filtered digital signal on its output. The control circuitry is operatively connected to the amplifier and to the converter and is also responsive to the gain control signals for dynamically adjusting power between the amplifier and converter when the gain control signals are changed.

32 Claims, 4 Drawing Sheets

POWER MANAGEMENT IN A DATA ACQUISITION SYSTEM

BACKGROUND OF THE INVENTION

1. Field of the Invention

The invention relates generally to electronic processing arrangements in a data acquisition system. More particularly, it relates to a method for reducing overall power in a data acquisition system. The present invention has use especially, but not exclusively, in the field of seismic sensing applications where it is desired to achieve significant power savings.

2. Description of the Prior Art

As is generally known in the art, a typical data acquisition system 100 comprises a PGA (programmable gain amplifier) block 102, an ADC (analog-to-digital converter) block 104, and a decimation filter block 106, as shown in FIG. 1 and labeled as "Prior Art." The system 100 may be used for converting an analog input signal of a signal source (seismic sensor or transducer) to a digital output signal. Specifically, the analog input signal is applied through input terminals 108, 110 to the PGA block 102 which, in turn, produces an amplified signal on its output lines 112, 114. The output lines 112, 114 from the PGA block 102 are coupled to the input of the ADC block 104 which generates a digitized signal on its output lines 116, 118. The digitized signal is passed to the decimation filter block 106 which produces the filtered digital output signal on output terminals 120, 122. The gain of the PGA block 102 is controlled by gain control signals at gain control lines 124-128. Since the input terminals 108, 110 may receive different input signals each having different voltage characteristics, the amount of amplification required to be provided by the amplifier block 102 can be adjusted via the signals applied at gain control lines 124-128 depending upon the signal level applied to the input terminals 108, 110.

In seismic applications, the dynamic range, power consumption and linearity of the PGA block 102 are critical parameters. Further, power conservation is a high priority since any power savings achieved will result in significant reduced cost for systems used for conducting seismic exploration. The total noise power of a channel in the digital acquisition system 100 is given by the sum (in RMS sense) of the noise power of the amplifier block 102 and the noise power of the ADC block 104. Depending upon the gain setting of PGA, the use of the PGA block 102 will reduce the ADC block's noise when that noise is input-referred to the PGA block's input. As defined herein, the "input-referred" noise at the input of the PGA block 102 means the noise of the ADC block 104 divided by the gain of the PGA block. The PGA block 102 is typically designed and rated for its input-referred noise. As the gain of the amplifier block 102 is increased, the noise at its output on lines 112, 114 will also be increased. Accordingly, at a lower gain setting of the PGA block 102, the contribution of the noise power from the amplifier will be invariably small when compared to the noise power from the ADC block 104, as the ADC block 104 may have a relatively high noise power.

However, the use of the PGA block 102 in the data acquisition system 100 of FIG. 1 suffers from a drawback of being power inefficient since there is no control of the power in either the amplifier block 102 and/or the ADC block 104 when the gain settings in the PGA block 102 are changed. It would therefore be desirable to provide a technique that reduces the overall power in a data acquisition system when the gain settings of the PGA block 102 are modified.

SUMMARY OF THE INVENTION

Accordingly, it is a general object of the present invention to provide a novel method for reducing overall power in a data acquisition system, which has been traditionally unavailable.

It is an object of the present invention to provide a method for reducing overall power in a data acquisition system when the gain settings in a PGA block are changed, but still maintaining substantially the same performance.

It is another object of the present invention to provide a method for reducing overall power in a data acquisition system in which power is dynamically shifted between a PGA block and an ADC block dependent upon changes in gain settings.

It is still another object of the present invention to provide a method of modifying the PGA and ADC circuitry when the power in the PGA and ADC blocks are modified, but the overall performance is maintained to be substantially the same.

It is still another object of the present invention to provide a data acquisition system which includes first current control circuitry connected to a programmable gain amplifier and being responsive to gain control signals for controlling the current level in the amplifier and second current control circuitry connected to an analog-to-digital converter and being also responsive to the gain control signals for controlling the current level in the converter.

In a preferred embodiment of the present invention, there is provided a data acquisition system which includes a programmable gain amplifier, an analog-to-digital converter, a filter, and control circuitry. The programmable gain amplifier is operatively connected to receive an analog input signal on its input and generates an amplified signal on its output in accordance with gain control signals. The analog-to-digital converter is operatively connected to receive the amplified signal from the amplifier and generates a digitized signal on its output. The filter is operatively connected to receive the digitized signal from the converter and generates a filtered digital signal on its output. The control circuitry is operatively connected to the amplifier and to the converter and is also responsive to the gain control signals for dynamically adjusting power between the amplifier and the converter when the gain control signals are changed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
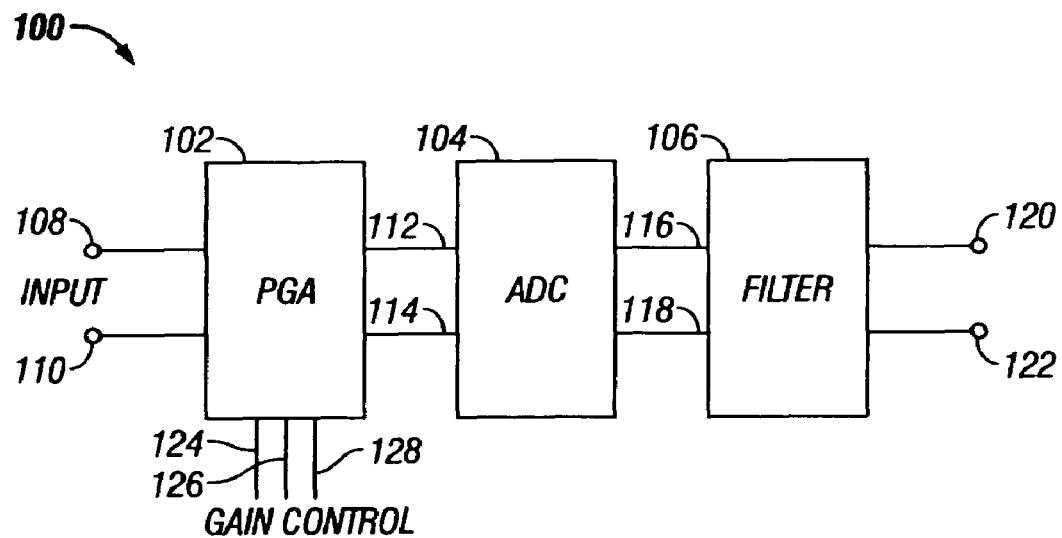
FIG. 1 is a block diagram of a conventional data acquisition system, which has been labeled "Prior Art"

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Before describing in detail the present invention, it is believed that it would be helpful as a background to explain the effect of the amplifier gain on the total output noise and input-referred noise as shown in Table I below for the PGA block 102 and the ADC block 104 in the conventional data acquisition system of FIGS. 1 and 2.

TABLE I

| Gain, A | Amplifier Noise, $v_{namp}$, (nV/√Hz) | ADC Noise, $v_{nadc}$, (nV/√Hz) | Total Output Noise, $v_{nout}$, (nV/√Hz) | Input Referred Noise, $v_{nin}$, (nV/√Hz) |
|---|---|---|---|---|
| 1 | 6 | 60 | 60.29925373 | 60.29925373 |
| 2 | 6 | 60 | 61.18823416 | 30.59411708 |
| 4 | 6 | 60 | 64.62197769 | 16.15549442 |
| 8 | 6 | 60 | 76.83749085 | 9.604686356 |
| 16 | 6 | 60 | 113.2077736 | 7.075485849 |
| 32 | 6 | 60 | 201.1566554 | 6.28614548 |
| 64 | 6 | 60 | 388.6592338 | 6.072800528 |
| 128 | 6 | 60 | 770.3401846 | 6.01828692 |

The total output noise $v_{nout}$ is determined mathematically from equation (1) below:

$$v_{nout} = \sqrt{[(A \cdot v_{namp})^2 + (v_{nadc})^2]} \quad (1)$$

Where
A is the gain of the PGA
$v_{namp}$ is the noise of the PGA
$v_{nadc}$ is the noise of the ADC Similarly, the input-referred noise $V_{nin}$ is given by equation (2) below:

$$v_{nin} = \sqrt{[(v_{namp})^2 + (v_{nadc}/A)^2]} \quad (2)$$

It should be apparently clear from Table I above that the contribution of the amplifier noise to the total noise (amplifier noise and ADC noise) becomes a significant portion only beyond a certain gain of the amplifier (e.g., gain of 16). In other words, at lower gain settings (e.g., 1, 2, 4, 8) the total output noise, $v_{nout}$, and the input-referred noise, $v_{nin}$, are dominated by the ADC noise and at the higher gain settings (e.g., gain of 32, 64, 128) the total output noise and the input-referred noise are dominated by the PGA noise.

Therefore, the noise of the amplifier can be made to be higher at a lower gain setting without degrading the overall performance of the system. The inventors of the present invention have realized that the noise of the amplifier at the lower gain settings can be increased to higher acceptable levels, which will also lead to significant savings in power.

In Table II below, the effect of amplifier gain (with its noise being varied) on the total output noise and the input-referred noise for a data acquisition system in accordance with the present invention is illustrated.

TABLE II

| Gain, A | Amplifier Noise, $v_{namp}$, (nV/√Hz) | ADC Noise, $v_{nadc}$, (nV/√Hz) | Total Output Noise, $v_{nout}$, (nV/√Hz) | Input Referred Noise, $v_{nin}$, (nV/√Hz) |
|---|---|---|---|---|
| 1 | 24 | 60 | 64.62197769 | 60.29925373 |
| 2 | 18 | 60 | 69.79142274 | 30.59411708 |
| 4 | 12 | 60 | 76.83749085 | 16.15549442 |
| 8 | 6 | 60 | 76.83749085 | 9.604686356 |
| 16 | 6 | 80 | 124.9639948 | 7.075485849 |
| 32 | 6 | 90 | 212.0471646 | 6.28614548 |
| 64 | 6 | 100 | 396.807258 | 6.072800528 |
| 128 | 6 | 120 | 777.3184676 | 6.01828692 |

As can be seen from Table II above, the noise of the amplifier has been increased for the lower gain settings (gain of 1 or 2) and this still does not contribute significantly to the total output noise. In view of this, the amplifier noise can be increased at the lower gain settings by reducing the current and thus saving power, but will not degrade the overall system's performance.

In addition, the inventors have recognized that the noise performance of the ADC block can be degraded (e.g., noise made higher) for the amplifier block operated at higher gain settings, thereby reducing power consumption in the ADC block so as to achieve further power savings. This savings in power is achieved without sacrificing the overall signal-to-noise performance.

Figure 2:
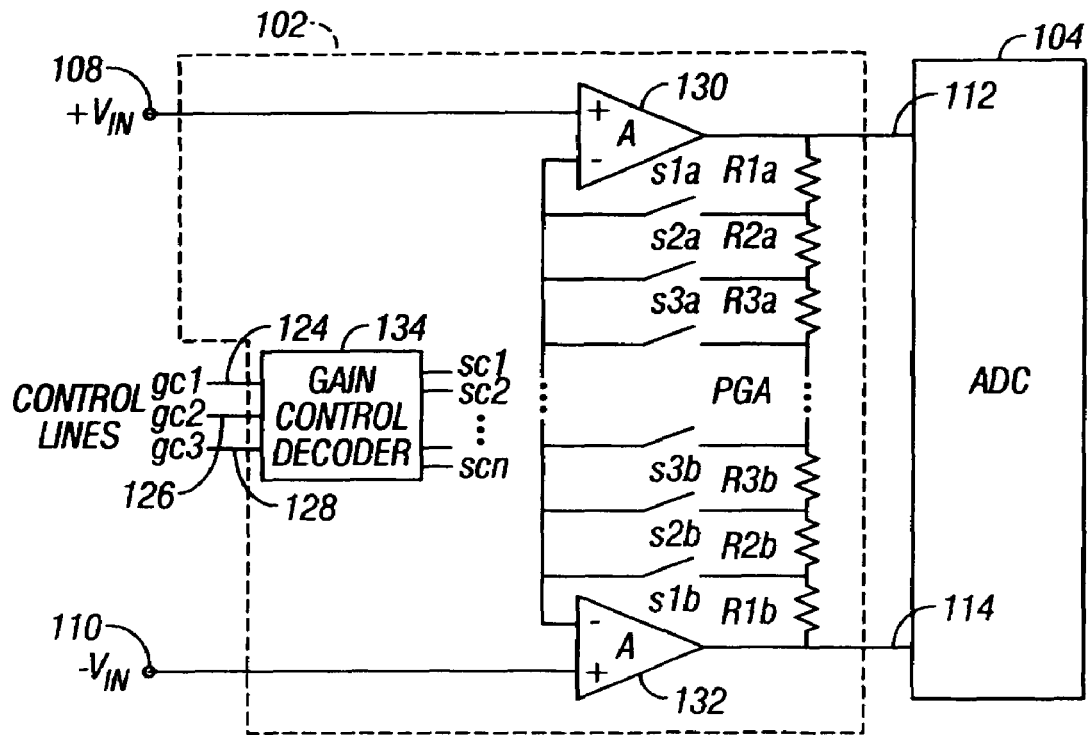
FIG. 2 is a more detailed block diagram of the PGA block 102 of FIG. 1, illustrating an exemplary gain control circuitry and labeled "Prior Art"

FIG. 2 is a more detailed block diagram of the prior art PGA block 102 of FIG. 1 which includes gain control circuitry. The PGA block 102 consists of first and second operational amplifiers 130, 132 and resistors R1a-R3a and R1b-R3b. The positive input voltage +Vin is applied on the line 108 connected to the non-inverting input of the operational amplifier 130, and the negative input voltage −Vin is applied to the non-inverting input of the operational amplifier 132. By selectively closing one pair of switches S1a, S1b; S2a, S2b; or S3a, S3b, the gain of the PGA block 102 may be programmably set. A gain control decoder 134 receives gain control signals gc1-gc3 on the respective gain control lines 124-128 and generates a plurality of switch control signals sc1, sc2 . . . scn for selectively configuring (activating and deactivating) of the corresponding switches S1a-S1b through S3a-S3b to achieve the desired gain.

Figure 3:
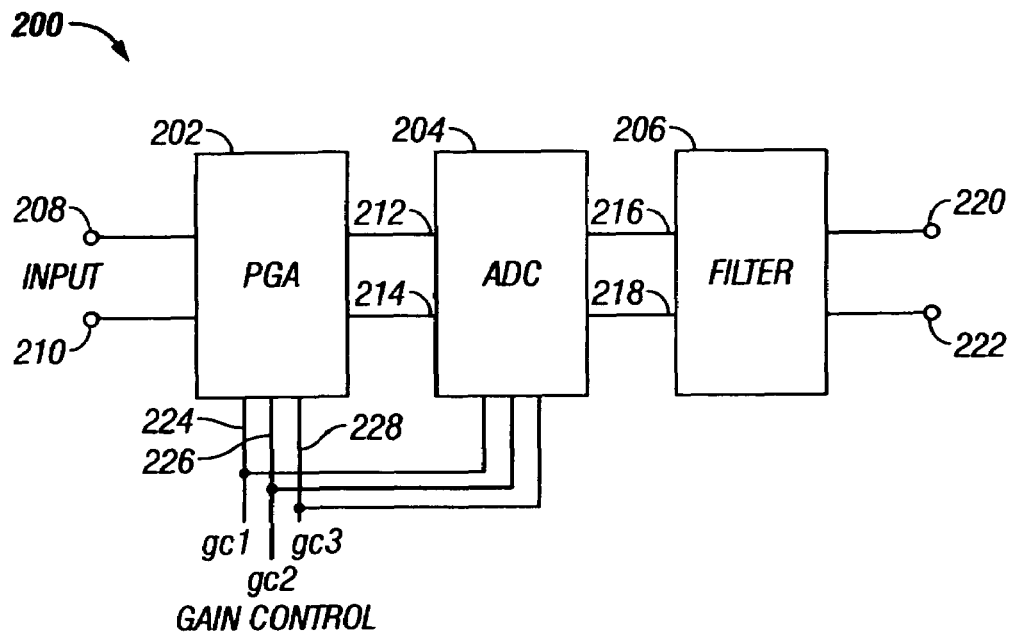
FIG. 3 is a block diagram of a data acquisition system, constructed in accordance with principles of the present invention.

Referring now to FIG. 3, there is illustrated in block diagram form a data acquisition system 200, which is constructed in accordance with the principles of the present invention. The system 200 comprises a PGA (programmable gain amplifier) block 202, an ADC (analog-to-digital converter) block 204, and a decimation filter block 206. The system 200 may be used for converting an analog input signal of a signal source (seismic sensor or transducer) to a digital output signal. Specifically, the analog input signal is applied through input terminals 208, 210 to the PGA block 202 which, in turn, produces an amplified signal on its output lines 212, 214. The output lines 212, 214 from the PGA block 202 are coupled to the input of the ADC block 204 which generates a digitized signal on its output lines 216, 218. The digitized signal is passed to the decimation filter block 206, which produces the digital output signal on output terminals 220, 222. The gain of the PGA block 202 using the gain control circuitry of FIG. 2 is controlled by gain control lines 224-228. As thus far described, the system 200 is identical in its construction as the data acquisition system 100 of FIG. 1.

Unlike the conventional data acquisition system of FIG. 1, the gain control lines 224-228 are not only connected to the PGA block 202 so as control the closed loop setting of the operational amplifiers 130, 132 via the switch control signals SC1, SC2 . . . SCn, but the same control lines are also used to vary the current levels in the operational amplifiers 130, 132 dependent upon the gain setting. While the current levels may be changed for each gain change listed in Table II, the current levels can be alternatively varied only when there is a change in gain ranges. For example, the gain settings from 1 to 4 may be defined as a "low gain" range; the gain settings from 8 to 16 may be defined as a "mid-gain" range; and the gain settings from 32 to 128 may be defined as a "high gain" range. Therefore, the current level can be varied only when there is a change between the low gain and mid-gain ranges or between the mid-gain and high gain ranges.

It should be clearly understood that in an amplifier the thermal noise is essentially due to the input stage and is further due to the input transistors in a properly designed amplifier. This thermal noise power is inversely proportional to the transconductance, gm, of the input transistors. This transconductance is, in turn, directly proportional to the square root of the size of the transistors and the current flowing therethrough. Accordingly, by decreasing the current and/or size of the transistors, thermal noise level will be increased so as to achieve a savings in power.

However, there are some adverse implications encountered when the current is decreased, such as the proper mode and/or region of operation of the transistors as well as the bandwidth of the amplifier being degraded. Consequently, it may be required to simultaneously re-size the input transistors as the current is being modified. Further, since the bandwidth of the amplifier is dependent upon the transconductance of the pair of input transistors and loading capacitors, it may be also necessary to modify the capacitors when the current is being varied.

Figure 4:
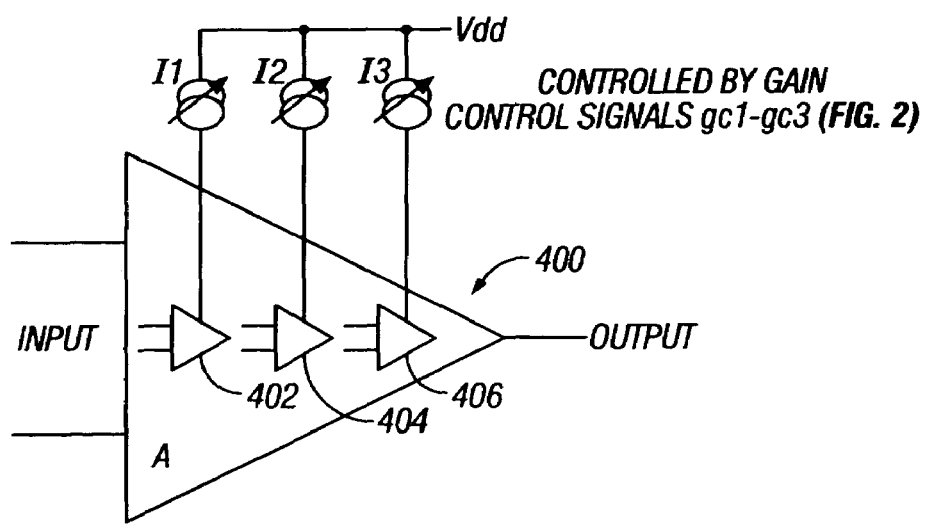
FIG. 4 is a representation of one circuit design of one of the amplifiers 130, 132 for implementing the PGA block 202 of FIG. 3.

In FIG. 4, there is depicted one circuit design for implementing the PGA block 202 of FIG. 3 which consists of a multi-stage amplifier 400 formed of a plurality (three shown in the exemplary amplifier) of stages 402, 404 and 406 each having its respective variable current sources I1-I3 controlled by the same gain control signals gc1-gc3. It should be apparent that each stage 402-406 can be implemented by using the PGA block 102 of FIG. 2 and adding the variable current sources I1-I3. The circuit design principles discussed above relative to decreasing the current in the amplifier may be required to be applied to all or some of the stages 402-404 of the multi-stage amplifier 400 in order to maintain its desired bandwidth. Further, the current level to each stage must be appropriately scaled in order to preserve the stability of the multi-stage amplifier.

Figure 5:
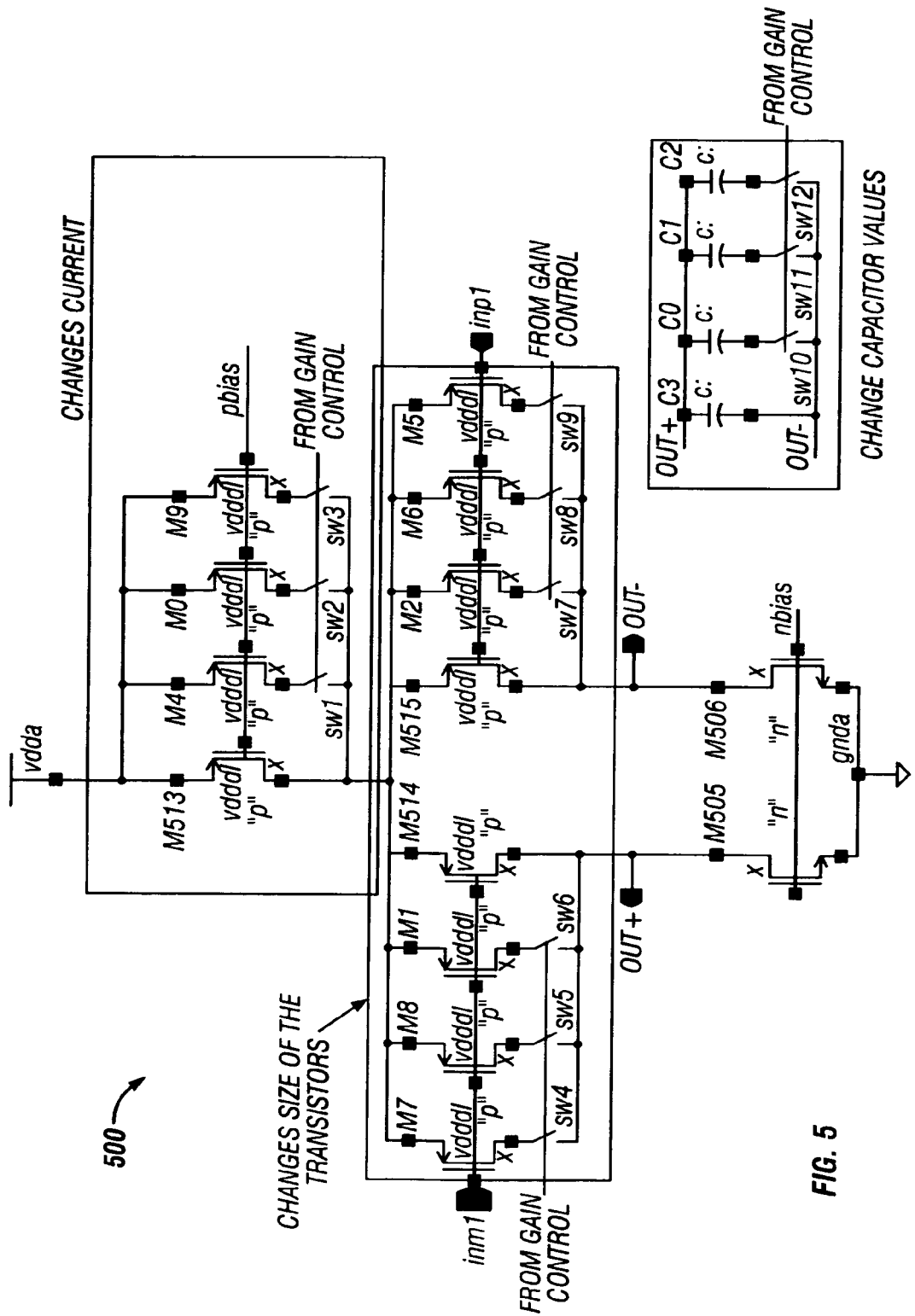
FIG. 5 is a schematic circuit diagram for implementing a portion of one stage of the multi-stage amplifier 400 of FIG. 4.

In FIG. 5, there is shown a schematic circuit diagram of an exemplary circuit design for implementing a portion of one stage 402 of the multi-stage amplifier 400 of FIG. 4. In other words, FIG. 5 is a detailed schematic of an operational amplifier 500 which is similar to the amplifier 130 of FIG. 2, but in which the gain control signals also control the current levels, sizes of the input transistors, and sizes of the loading capacitors.

The operational amplifier 500 includes a pair of first and second input transistors M514, M515 having gates that are connected to the respective negative and positive input terminals inm1, inp1. The sources of the input transistors are connected together and to the drain of a load transistor M513. The source of transistor M513 is connected to a power supply VDD, and the gate thereof is connected to receive a bias voltage pbias. The positive output out+ is connected to the drain of the input transistor M514, and the negative output out− is connected to the drain of the input transistor M515.

In order to modify the current level, current control circuitry which includes series-connected current mirror transistors M4, M0 and M9 and the respective switches SW1-SW3 are connected in parallel with the load transistor M513. The same gain control signals gc1-gc3 (FIG. 3) are used to selectively close the switches SW1-SW3 for varying the current. Similarly, in order to modify the size of the first input transistor, transistor-size control circuitry including series-connected transistors M7, M8 and M1 and their respective switches SW4-SW6 are connected in parallel therewith. Also, in order to modify the size of the second input transistor, transistor-size control circuitry including of series-connected transistors M2, M6 and M5 and their respective switches SW7-SW9 are connected in parallel therewith. Again, the same gain control signals gc1-gc3 are used to selectively close the switches SW4-SW6 and SW7-SW9.

Further, a load capacitor C3 is connected between the positive and negative outputs. In order to change the value of the load capacitor, capacitor-size control circuitry formed of series-connected capacitors C0-C2 and their respective switches SW10-SW12 are connected in parallel therewith. Likewise, the same gain control signals gc1-gc3 are used to selectively close the switches SW10-SW12. The current control, transistor-size control, and capacitor-size control scheme can be expanded by adding corresponding transistors or capacitors with associated switches in parallel with the load transistor, input transistors, and load capacitor, respectively.

In the case of a switched capacitor delta-sigma modulator ADC, most of the noise is contributed by the switch noise given by kT/C and the thermal noise of the first integrator in the switched capacitor delta-sigma modulator. In order to reduce or save power in the ADC, the current in the first integrator, which is basically an operational amplifier similar to the amplifier 500 of FIG. 5, is reduced. As a result, the thermal noise of the first integrator will increase for the same reason as explained earlier for the operational amplifier 500. This reduction of current will also adversely affect the bandwidth of the first integrator. Therefore, the value of the integrating capacitor of the integrator has to be decreased so as to maintain the bandwidth. This decrease will, in turn, necessitate a decrease in the value of the sampling capacitor of the integrator, thereby increasing the switch noise.

Figure 6:
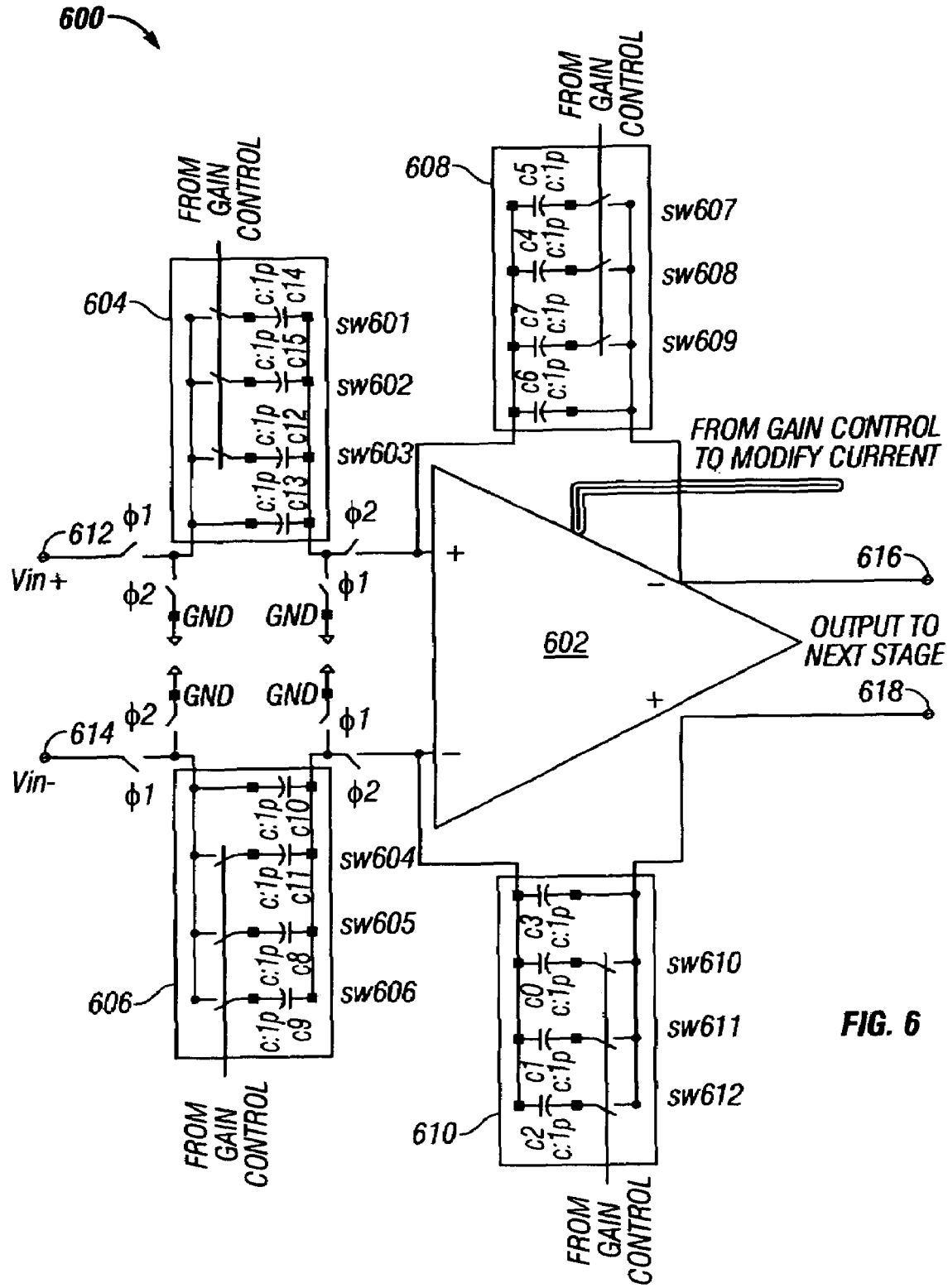
FIG. 6 is a schematic circuit diagram for implementing the front end portion of a switched capacitor delta-sigma modulator of the ADC 204 in FIG. 3.

In FIG. 6, there is shown a schematic circuit diagram of an exemplary circuit design for implementing a front end portion 600 (sampling network and first integrator) of a switched capacitor delta-sigma modulator ADC. The front end portion 600 includes a first integrator 602, a first bank 604 of sampling capacitors and switches, a second bank 606 of sampling capacitors and switches, a third bank 608 of integrating capacitors and switches, and a fourth bank 610 of integrating capacitors and switches. The first integrator 602 is a differential input/differential output operational amplifier, which is constructed similar to the amplifier in FIG. 5. Thus, the first integrator is operated in the same manner as the amplifier 500 wherein the same gain control signals gc1-gc3 are also used to control or vary the amplifier current (power), input transistor sizes, and load capacitor sizes.

The first bank 604 is formed of parallel-connected sampling capacitors C12, C14, C15 and with series connected switches SW601-SW603 interconnected to the input terminal 612 and the non-inverting input of the first integrator 602 and across a sampling capacitor C13. The second bank 606 is formed of parallel-connected sampling capacitors C8, C9, C11 and with series connected switches SW604-SW606 interconnected to the input terminal 614 and the inverting input of the first integrator 602 and across a sampling capacitor C10. The third bank 608 is formed of parallel-connected integrating capacitors C4, C5, C7 and with series connected switches SW607-SW609 interconnected to the non-inverting input and the inverting output terminal 616 of the first integrator 602 and across a sampling capacitor C6. The fourth bank 610 is formed of parallel-connected integrating capacitors C0-C2 and with series connected switches SW610-SW612 interconnected to the inverting input and the non-inverting output terminal 618 of the first integrator 602 and across a sampling capacitor C3.

In operation, in the first state, all of the switches Φ1 are closed and all of the switches Φ2 are opened so as to allow the input signals Vin+ and Vin− applied to the input terminals 612 and 614 to charge up one of the sampling capacitors C12-C15 and one of the sampling capacitor C8-C11 dependent upon the operation of the corresponding switches SW601-SW606. In the second state, all of the switches Φ2 are closed and all of the switches Φ1 are opened so as to allow the voltages stored on the particular sampling capacitor during the first state to be transferred to the non-inverting and inverting inputs of the integrator and to one of the integrating capacitors C4-C7 and one of the integrating capacitors C0-C3 dependent upon the operation of the switches SW607-SW612. The same gain control signals gc1-gc3 are used again to selectively configure the switches SW601 through SW612.

Referring back again to the Tables I and II above, the total output noise and input-referred noise in Table II are not much different when compared to the ones in the conventional data acquisition system of Table I. Therefore, this comparison confirms that the noise performance in the system 200 of the present invention would be similar to the traditional system 100. However, based upon the power management discussed herein, the amplifier noise (second column in Table II) is made higher at the lower gain settings so as to save power in the amplifier. In addition, the ADC noise (third column of Table II) is made higher at the higher gain settings so as to save power in the ADC. In this example, the power consumption in the present system will be equal to the power consumption in the traditional system at the gain setting of 8. Nevertheless, it should be appreciated by those skilled in the art that the particular gain setting can be optimized for a desired application. By applying this power management concept in accordance with the present invention, significant overall power savings can be achieved by dynamically adjusting power from the PGA to the ADC and from the ADC to the PGA as the gain settings of the amplifier are changed.

From the foregoing detailed description, it can thus be seen that the present invention provides a data acquisition system which includes a programmable gain amplifier, an analog-to-digital converter, a filter, and control circuitry. The control circuitry of the present invention is operatively connected to the amplifier and to the converter and is also responsive to gain control signals for dynamically adjusting power between the amplifier and converter when the gain control signals are changed.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. A data acquisition system, comprising:
a programmable gain amplifier operatively connected for receiving an analog input signal and for generating an amplified output signal in accordance with gain control signals;
an analog-to-digital converter operatively connected for receiving the amplified output signal from said programmable gain amplifier and for generating a digitized output signal; and
control circuitry operatively connected to said programmable gain amplifier and to said analog-to-digital converter and being also responsive to said gain control signals, wherein when an output amplifier noise level is lower than an output analog-to-digital converter noise level at lower gain settings, the control circuitry allows the output amplifier noise level to be made higher so as to save power in the amplifier.

2. A data acquisition system as claimed in claim 1, wherein said control circuitry includes current control circuitry for controlling a current level in said programmable gain amplifier so as to decrease the current level when said gain control signals produce at least one of the lower gain settings in said programmable gain amplifier, thereby reducing the overall power consumption of the system.

3. A data acquisition system as claimed in claim 2, wherein the current level in said analog-to-digital converter is increased when said gain control signals produce said at least one of the lower gain settings so as to lower the noise level in said analog-to-digital converter, thereby further reducing the overall power consumption of the system.

4. A data acquisition system as claimed in claim 1, wherein when an output analog-to-digital converter noise level is higher than an output amplifier noise level at higher gain settings, the control circuitry allows the output analog-to-digital converter noise level to be made higher so as to save power in the output analog-to-digital converter.

5. A data acquisition system as claimed in claim 4 wherein said control circuitry further includes current control circuitry for controlling a current level in said analog-to-digital converter so as to decrease the current level when said gain control signals produce at least one of the higher gain settings in said programmable gain amplifier, thereby reducing the overall power consumption of the system.

6. A data acquisition system as claimed in claim 5, wherein the current level in said programmable gain amplifier is increased when said gain control signals produce said at least one of the higher gain settings so as to lower the noise level in said programmable gain amplifier, thereby further reducing the overall power consumption of the system.

7. A data acquisition system as claimed in claim 5, wherein said control circuitry includes current control circuitry for controlling the current level in said programmable gain amplifier so as to decrease the current level when said gain control signals produce said at least one of the lower gain settings in said programmable gain amplifier, thereby dynamically adjusting power from said amplifier means to said analog-to-digital converter.

8. A data acquisition system as claimed in claim 1, wherein said analog-to-digital converter is an oversampling analog-to-digital converter.

9. A data acquisition system as claimed in claim 8, wherein said oversampling analog-to-digital converter is a delta-sigma analog-to-digital converter.

10. A data acquisition system as claimed in claim 1, wherein said analog-to-digital converter is a non-oversampling analog-to-digital converter.

11. A method for reducing overall power in a data acquisition system, comprising:
   amplifying an analog input signal with a programmable gain amplifier to generate an amplified signal in accordance with gain control signals;
   converting the amplified signal with an analog-to-digital converter to generate a digitized signal; and
   increasing an output amplifier noise level so as to save power in the amplifier when the output amplifier noise level is lower than an output analog-to-digital converter noise level at lower gain settings.

12. A method for reducing overall power in a data acquisition system as claimed in claim 11, wherein adjusting power includes controlling a current level in said programmable gain amplifier so as to decrease the current level when the gain control signals produce at least one of the lower gain settings in the programmable gain amplifier, thereby reducing the overall power consumption of the system.

13. A method for reducing overall power in a data acquisition system as claimed in claim 11, further includes increasing the output analog-to-digital converter noise level so as to save power in the output analog-to-digital converter when the output analog-to-digital converter noise level is higher than the output amplifier noise level at higher gain settings.

14. A method for reducing overall power in a data acquisition system as claimed in claim 12, further includes increasing the current level in the analog-to-digital converter when the gain control signals produce the at least one of the lower gain settings so as to lower the noise level in the analog-to-digital converter for further reducing the overall power consumption of the system.

15. A method for reducing overall power in a data acquisition system as claimed in claim 13, wherein adjusting power includes controlling a current level in the analog-to-digital converter so as to decrease the current level when the gain control signals produces at least one of the higher gain settings in the programmable gain amplifier, thereby reducing the overall power consumption of the system.

16. A method for reducing overall power in a data acquisition system as claimed in claim 15, wherein adjusting power includes controlling a current level in the programmable gain amplifier so as to decrease the current level when the gain control signals produce said at least one of the lower gain settings in the programmable gain amplifier, thereby dynamically adjusting the power from the programmable gain amplifier to the analog-to-digital converter.

17. A method for reducing overall power in a data acquisition system as claimed in claim 16, further includes increasing the current level in the programmable gain amplifier when the gain control signals produce the at least one of the higher gain settings so as to lower the noise level in the programmable gain amplifier for further reducing the overall power consumption of the system.

18. A method for reducing overall power in a data acquisition system as claimed in claim 11, wherein said analog-to-digital converter is an oversampling analog-to-digital converter.

19. A method for reducing overall power in a data acquisition system as claimed in claim 18, wherein said oversampling analog-to-digital converter is a delta-sigma analog-to-digital converter.

20. A method for reducing overall power in a data acquisition system as claimed in claim 11, wherein said analog-to-digital converter is a non-oversampling analog-to-digital converter.

21. A data acquisition system, comprising:
   a programmable gain amplifier operatively connected for receiving an analog input signal and for generating an amplified output signal in accordance with gain control signals;
   an analog-to-digital converter operatively connected for receiving the amplified output signal from said programmable gain amplifier and for generating a digitized output signal; and
   control circuitry operatively connected to said programmable gain amplifier and to said analog-to-digital converter and being also responsive to said gain control signals, wherein when an output analog-to-digital converter noise level is higher than an output amplifier noise level at higher gain settings, the control circuitry allows the output analog-to-digital converter noise level to be made higher so as to save power in the output analog-to-digital converter.

22. A data acquisition system as claimed in claim 21, wherein said control circuitry further includes current control circuitry for controlling a current level in said analog-to-digital converter so as to decrease the current level when said gain control signals produce at least one of the higher gain settings in said programmable gain amplifier, thereby reducing the overall power consumption of the system.

23. A data acquisition system as claimed in claim 21, wherein said analog-to-digital converter is an oversampling analog-to-digital converter.

24. A data acquisition system as claimed in claim 23, wherein said oversampling analog-to-digital converter is a delta-sigma analog-to-digital converter.

25. A data acquisition system as claimed in claim 21, wherein said analog-to-digital converter is a non oversampling analog-to-digital converter.

26. A data acquisition system as claimed in claim 22, wherein the current level in said programmable gain amplifier is increased when said gain control signals produce said at least one of the higher gain settings so as to lower the noise level in said programmable gain amplifier, thereby further reducing the overall power consumption of the system.

27. A method for reducing overall power in a data acquisition system, comprising:
   amplifying an analog input signal with a programmable gain amplifier to generate an amplified signal in accordance with gain control signals;
   converting the amplified signal with an analog-to-digital converter to generate a digitized signal; and
   increasing an output analog-to-digital converter noise level so as to save power in the output analog-to-digital converter when the output analog-to-digital noise level is higher than an output amplifier noise level at higher gain settings.

28. A method for reducing overall power in a data acquisition system as claimed in claim 27, further includes controlling a current level in the analog-to-digital converter so as to decrease the current level when the gain control signals produce at least one of the higher gain settings in the programmable gain amplifier for further reducing the overall power consumption of the system.

29. A method for reducing overall power in a data acquisition system as claimed in claim 27, wherein said analog-to-digital converter is an oversampling analog-to-digital converter.

30. A method for reducing overall power in a data acquisition system as claimed in claim 29, wherein said oversampling analog-to-digital converter is a delta-sigma analog-to-digital converter.

31. A method for reducing overall power in a data acquisition system as claimed in claim 27, wherein said analog-to-digital converter is a non-oversampling analog-to-digital converter.

32. A method for reducing overall power in a data acquisition system as claimed in claim 28, further includes increasing the current level in the programmable gain amplifier when the gain control signals produce the at least one of the higher gain settings so as to lower the noise level in the programmable gain amplifier for further reducing the overall power consumption of the system.

* * * * *